United States Patent
Kharisov

(10) Patent No.: US 11,019,754 B2
(45) Date of Patent: May 25, 2021

(54) ACOUSTIC AND VIBRATION MITIGATION IN A DATA STORAGE SYSTEM

(71) Applicant: Seagate Technology LLC, Cupertino, CA (US)

(72) Inventor: Evgeny R. Kharisov, Brooklyn, NY (US)

(73) Assignee: Seagate Technology LLC, Fremont, CA (US)

( * ) Notice: Subject to any disclaimer, the term of this patent is extended or adjusted under 35 U.S.C. 154(b) by 74 days.

(21) Appl. No.: 16/457,272

(22) Filed: Jun. 28, 2019

(65) Prior Publication Data

US 2020/0413573 A1    Dec. 31, 2020

(51) Int. Cl.
*H05K 7/20* (2006.01)
*G05B 19/4155* (2006.01)

(52) U.S. Cl.
CPC ..... *H05K 7/20836* (2013.01); *G05B 19/4155* (2013.01); *H05K 7/20145* (2013.01); *H05K 7/20172* (2013.01); *H05K 7/20727* (2013.01); *G05B 2219/49215* (2013.01)

(58) Field of Classification Search
CPC .... H05K 7/20727; F25D 23/12; G05D 23/00; G06F 9/2094
See application file for complete search history.

(56) References Cited

U.S. PATENT DOCUMENTS

| | | | |
|---|---|---|---|
| 6,141,213 A | 10/2000 | Antonuccio et al. | |
| 6,545,438 B1 | 4/2003 | Mays, II | |
| 9,329,586 B2 | 5/2016 | Artman et al. | |
| 9,506,821 B1* | 11/2016 | Robillard | G01K 11/00 |
| 9,541,971 B2 | 1/2017 | Haridass et al. | |
| 9,820,409 B1 | 11/2017 | Ross et al. | |
| 10,168,748 B2 | 1/2019 | Shabbir et al. | |
| 2011/0029151 A1* | 2/2011 | Tang | G05D 23/1917 700/300 |
| 2014/0073234 A1 | 3/2014 | Elison et al. | |
| 2015/0330397 A1* | 11/2015 | Alshinnawi | G05D 7/0617 700/282 |
| 2016/0349716 A1* | 12/2016 | Slessman | G06F 1/206 |
| 2017/0160771 A1* | 6/2017 | Albrecht | G06F 1/206 |
| 2020/0245503 A1* | 7/2020 | Chialastri | H05K 7/20736 |

OTHER PUBLICATIONS

Ahuja, Real Time Monitoring and Availability of Server Airflow for Efficient Data Center Cooling, 2013, Intel Corporation,, IEEE, p. 1-5. (Year: 2013).*

* cited by examiner

*Primary Examiner* — Kidest Bahta
(74) *Attorney, Agent, or Firm* — Hall Estill Attorneys at Law

(57) ABSTRACT

A data storage system can be vigilant of the acoustic impedance between cooling features and a data storage device to prevent operational degradation in the data storage device as a result of cooling operations from the cooling features. One or more cooling feature may each be positioned on an opposite sides of an air plenum from a data storage device with each cooling feature connected to a cooling module configured to adjust a speed of the first cooling feature in response to a detected operational condition in the data storage device. The cooling features speed adjustment is executed independently to correct an acoustic and vibration disturbance interference in the data storage system.

20 Claims, 3 Drawing Sheets

US 11,019,754 B2

ACOUSTIC AND VIBRATION MITIGATION IN A DATA STORAGE SYSTEM

SUMMARY

In some embodiments, a data storage system has a first cooling feature and a second cooling feature each positioned on a first side of an air plenum, opposite a data storage device positioned on a second side of the air plenum with each cooling feature connected to a cooling module. A speed of the first cooling feature is adjusted as directed by the cooling module in response to a detected operational condition in the data storage device to correct an acoustic and vibration disturbances in the air plenum.

A data storage system can be arranged, in accordance with various embodiments, with a first cooling feature and a second cooling feature each positioned on an opposite side of an air plenum from a data storage device. Each cooling feature is connected to a cooling module configured to adjust a speed of the first cooling feature in response to a detected operational condition in the data storage device to correct an acoustic and vibration disturbances in the air plenum.

Operation of a data storage system consists, in other embodiments, of positioning a first cooling feature and a second cooling feature on a first side of an air plenum, opposite a data storage device positioned on a second side of the air plenum with each cooling feature connected to a cooling module. Operating conditions are detected by the cooling module during a data access request in order to generate a cooling strategy derived from the detected operating conditions. As directed by the cooling module and cooling strategy, a speed of the first cooling feature is adjusted in response to a detected operational event corresponding with an acoustic and vibration disturbances in the air plenum.

DETAILED DESCRIPTION

Figure 1:
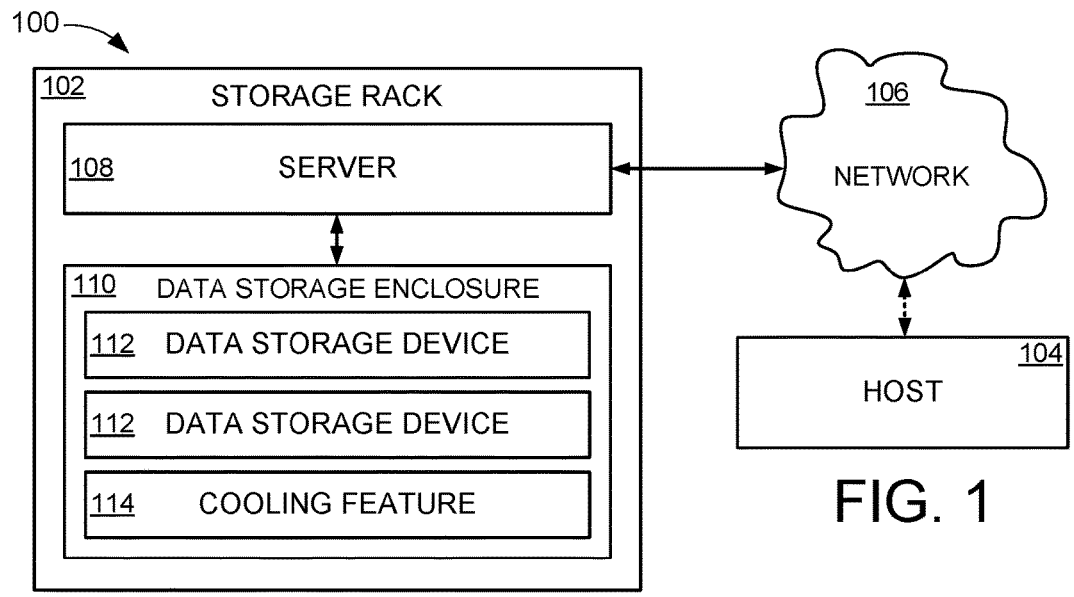
FIG. 1 is a block representation of an example data storage system in with various embodiments can be practiced.

Various embodiments of the present disclosure are generally directed to a data storage system that employs intelligent acoustic impedance control to provide real-time optimized data storage performance.

There is a continued push for greater volumes of data storage capacity by industry and consumers. Increased data capacity can be achieved by utilizing data storage devices with greater data storage capacity and/or utilizing multiple data storage devices concurrently. While higher capacity data storage devices can be useful, many sophisticated computing systems concurrently employ numerous, separate data storage devices to provide a collectively large capacity for data. The operation of numerous data storage devices can generate heat at a rate that can degrade data storage performance if not actively cooled by convective airflow produced by fans.

The cooling of data storage devices can be particularly difficult in rack data storage environments. Rack data storage environments physically load as many separate data storage devices as possible into data storage enclosures to maximize the amount of data storage capacity per physical area in a rack. To mitigate the production of heat in data storage systems with numerous data storage devices, cooling features, such as fans, heatsinks, and intercoolers, can be utilized. However, the use of cooling features can produce acoustic characteristics, such as sound pressure, sound level, and sound power that degrade data storage device performance.

It is contemplated that the use of numerous cooling features concurrently on one or more data storage devices results in harmonic beating and acoustic disturbance amplification through interference that physically traumatize and/or shock the operational aspects of the data storage device(s). Such harmonic beating and acoustic disturbance amplification can be attributed to acoustic and vibration disturbances from different cooling features in a data storage enclosure and around the data storage devices. Such acoustic and vibration disturbances can be characterized, but are not limited to acoustic and vibration disturbances with acoustic impedance being defined as the ratio of the pressure of a sound wave to the rate of particle flow across an imaginary surface.

It is noted that "sound pressure level" (SPL) is meant as a pressure disturbance whose intensity is influenced by the strength of the source, shape of the surroundings, and distance from the source. Sound pressure can be measured by sound meters in dB and induces vibration and movement in objects encountering the acoustic energy. Vibration can be characterized as an oscillation in the physical structure, or surrounding fluid, of an object.

Accordingly, assorted embodiments are directed to a data storage device positioned in a housing with a first cooling feature and a second cooling feature that are each connected to a cooling module configured to optimize acoustic impedance and vibration disturbance environment in the housing by varying the cooling operation of the first cooling feature in response to the cooling operation of the second cooling feature. By generating a real-time adaptive cooling strategy that reactively and proactively corrects for acoustic and mechanical disturbance interference in the data storage housing and around the constituent data storage devices, high data storage performance of the data storage devices can be maintained over time.

In existing systems, the fan speed of a cooling unit is adjusted together for all fans only to address thermal conditions, which is the main input for the fan controller and its objective is to maintain the temperature within given specification. Assorted embodiments suggest adding independent fan control as a new control variable and use that control to address acoustic and vibration conditions along with the thermal environment around one or more data storage devices. Fans can be positioned in many possible ways, but it is noted that the positioning of a fan is generally not relevant and disturbances from cooling fans occur when the output airflow is interfering with each other and amplify for some of data storage device locations within an enclosure.

It is contemplated that sensors are used to evaluate the acoustic and vibration conditions of a data storage system, or they can be determined during design for each of the fan speeds and programmed into the controller. It is noted that acoustic and vibration disturbance mainly depend on the fan speed for a given data storage system and, once measured during development for each fan speed, it can be used to design independent fan control profiles that obviate the need for continuous, or sporadic, sensor operation. It is further noted that a disturbance is to be understood as both "acoustic and vibration," which can contrast separate definitions where acoustics travel through the air and vibrations travel through the mechanical structures.

FIG. 1 is a block representation of an example data storage system 100 in which various embodiments of the present disclosure can be employed. The data storage system 100 can connect one or more storage racks 102 with a remote host 104 via wired and/or wireless network(s) 106 to allow the local and remote generation and storage of data. As shown, a storage rack 102 can have a server 108 that directs data to, and from, at least one data storage enclosure 110 physically supported by the storage rack 102. While a rack 102 and server 108 configuration is shown in FIG. 1, an acoustic and vibration disturbance optimization may be applied within an individual, out-of-rack 102 server, data storage enclosure 110, or data storage device 112 that employ multiple cooling features 114.

Although a data storage enclosure 110 can be configured to be a diverse variety of sizes and performance capabilities, some embodiments position a plurality of data storage devices 112 in the data storage enclosure 110 to be convectively cooled via one or more cooling feature(s) 114. It is noted that the data storage devices 112 can be similar or dissimilar types, capacities, and physical positions within the data storage enclosure. Likewise, one or more cooling features may be concurrently employed with different types, cooling capabilities, locations, and orientations with respect to the data storage devices 112. The ability to selectively utilize diverse data storage device 112 and cooling feature 114 configurations allows the data storage enclosure 110 to be customized to a wide variety of data storage demands, such as cloud computing, archive data storage, and online digital content streaming.

Figure 2:
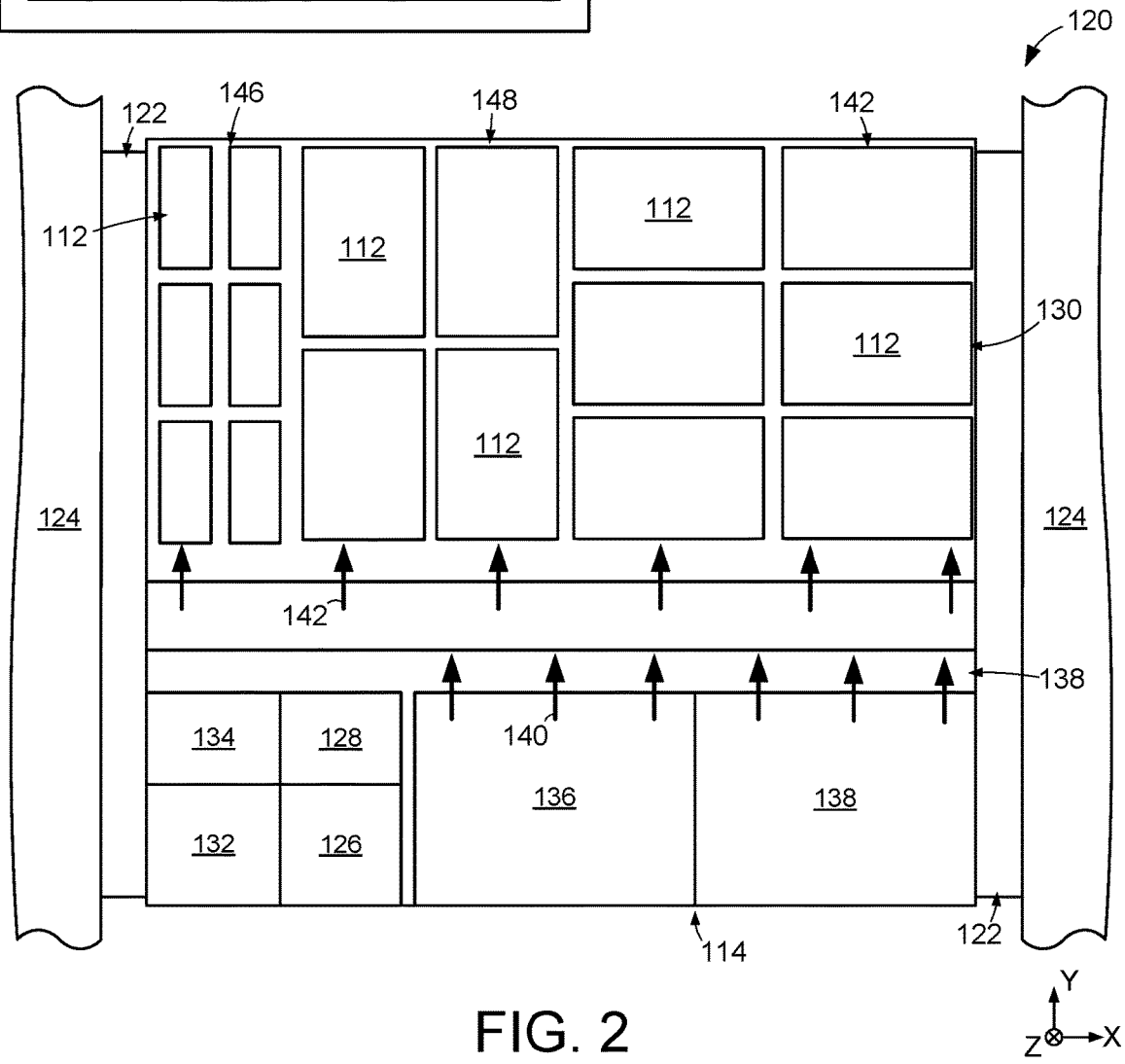
FIG. 2 shows a top view representation of an example data storage rack capable of being used in the data storage system of FIG. 1.

FIG. 2 illustrates a top view line representation of a portion of an example data storage rack 120 that can be utilized in the data storage system 100 of FIG. 1. The data storage rack 120 can support a number of data storage enclosure(s) 110 that has a rigid, or semi-flexible, frame. Any number of support rails 122 can extend from the data storage enclosure 110 to physically attach to the rack supports 124. It is noted that the support rails 122 may be configured to allow selective insertion, electrical connection, and removal of the data storage enclosure 110 relative to the rack supports 124.

The data storage enclosure 110 can incorporate at least one local controller 126, such as a microprocessor, and local memory 128, such as volatile and/or non-volatile solid-state memory to coordinate and direct operations within the enclosure 110. For instance, the controller 126 and memory 128 can monitor data capacity of the various separate data storage devices in the data storage region 130, power consumption supplied by the local power supply 132, and at least one environmental condition, such as temperature, humidity, and vibration, with one or more sensors 134 positioned within the enclosure 110. The ability to continuously or sporadically monitor a variety of different operating parameters within the enclosure 110 allows for intelligent activation of at least a first cooling feature 136 and a second cooling feature 138 to maintain a predetermined data storage device operating temperature range without unduly draining power or inducing vibration in the enclosure 110.

In order to accommodate increased numbers of data storage devices 112 being packaged together in the data storage region 130, greater numbers and/or more powerful cooling features 136/138 are employed. However, even cooling features 136/138 operating at peak efficiency can create acoustic and vibration interference and SPL that damages the assorted data storage devices 112. In other words, the cooling capabilities needed to maintain the high number of data storage devices 112 at optimal operating temperatures often produce acoustic and vibration interference and sound pressures that vibrates the data storage devices 112 enough to degrade data storage performance, which can be characterized as "acoustic and vibration performance degradation."

Various embodiments combat such degrading acoustic and vibration operation in a data storage device, or enclosure, employing multiple cooling features 136/138 by executing a cooling strategy that mitigates acoustic and vibration interference and the generation of relatively high SPL. The cooling strategy allows for independent control of the cooling features 136/138 as a function of the operating temperatures of the data storage devices 112 being cooled. As such, acoustic resonances and harmonic beating of the respective data storage devices 112 are mitigated or eliminated through execution of the cooling strategy generated by the local controller 126.

Figure 3:
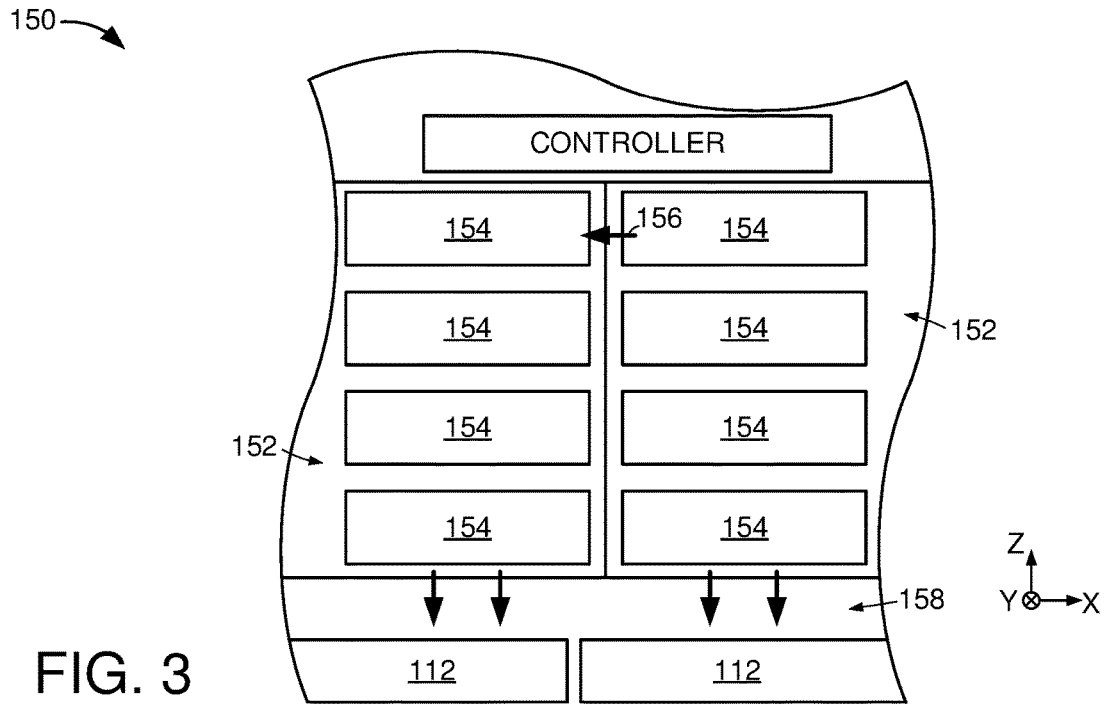
FIG. 3 depicts a top view block representation of portions of an example data storage system arranged in accordance with assorted embodiments

The top view line representation of FIG. 3 depicts an example data storage system 150 in which assorted embodiments can be practiced. The data storage system 100 positions two fan boxes 152 within a common housing with multiple data storage devices 112. Each fan box 152 can contain multiple rotating fans 154 while some embodiments place the fans 154 so that the output of one fan 154 intakes into a second fan 154, as conveyed by the airflow direction 156 that passes through a first fan 154 of a fan box 152 before entering a second fan 154.

With multiple fan boxes 142 each being active to provide convective cooling of the data storage devices 112, broad spectrum acoustic frequencies can be experience, such as 250 Hz and/or 1.2 kHz harmonics. The broad spectrum frequencies can create acoustic and vibration disturbance interference that results in harmonic disturbance in the air plenum 148 and around the respective data storage devices 112, which produces sound pressure and vibrations greater enough to vibrate and degrade operation of the data storage devices 112.

It is noted that acoustic and vibration disturbance interference is not required for data storage performance degrading sound pressure to be experienced in the air plenum 148 as uniform acoustic impedance can allow high levels of SPL. In yet, acoustic and vibration disturbance interference can be directly linked to degrading sound pressure levels that are not necessarily high, but varying over time to produce temporary, but frequent, performance drops. Hence, the level and uniformity of sound pressure over time can each be detrimental to the operation and performance of a data storage device 112.

Figure 4:
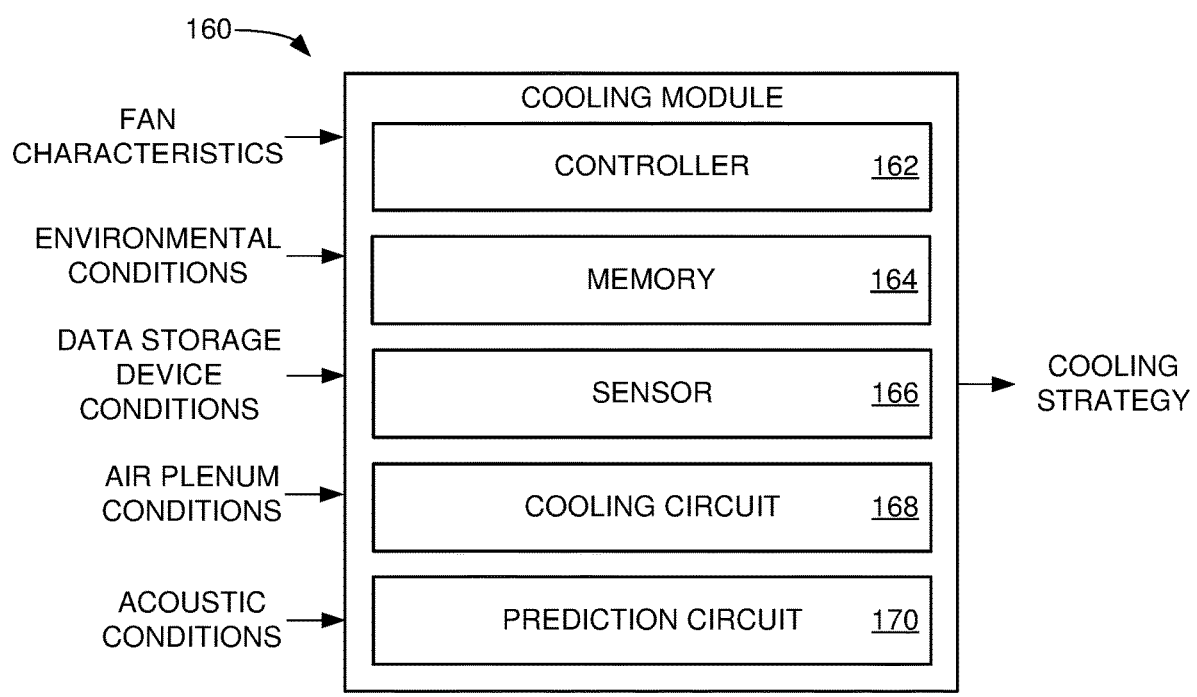
FIG. 4 illustrates a block representation of an example cooling module that can be utilized in the embodiments of a data storage system.

FIG. 4 depicts a block representation of an example cooling module 160 that can be utilized in a data storage system to generate a cooling strategy that mitigates and/or eliminates performance degrading characteristics. A cooling module 160 can realized partially, or completely, in hardware or software of a data storage system. For example, a data storage device 112 may have a cooling module resident in software while a data storage enclosure 110 may have a cooling module resident in circuitry of a printed circuit board.

Regardless how a cooling module 160 is arranged, the module 160 can employ a local controller 162, such as a microprocessor or programmable circuitry, that carries out the intake and processing of inputted data to generate a cooling strategy. The local controller 162 can utilize one or more memories 164 to temporarily, or permanently, store pertinent hardware and operational characteristics, such as model data, algorithms, and past cooling strategies, that aid in the efficiency and accuracy of a new cooling strategy.

The local controller 162 may activate and/or poll one or more sensors 166 that measure various aspects of a data storage system. As a non-limiting example, a first sensor 166 can measure fan voltage while a second sensor 166 measures air velocity, a third sensor 166 measures SPL proximal a data storage device, and a fourth sensor 166 measures air temperature to provide operational data for the local controller 162 to understand the real-time current conditions of the system. It is noted that any number, type, and position of sensor 166 can be utilized to provide independent or redundant measurements of hardware operation as well as environmental conditions in the data storage system. The performance of a data storage device, such as error rate, head position errors, repeatable runout, and data access latency, can be employed by the local controller 162 to identify the acoustic conditions around a data storage device.

The cooling module 160 can employ a cooling circuit 168 to correlate real-time operational and environmental conditions with fan characteristics to determine the presence, and severity, of acoustic impedance gradient at least in the air plenum and around data storage devices. That is, the cooling circuit 168 operates in conjunction with the local controller 162 to derive the acoustic conditions around data storage devices as a result of fan operation. It is contemplated that one or more sensors 166 such as an oscilloscope or decibel meter, may be selectively activated by the cooling circuit 168 to verify previously measured, or derived, acoustic conditions, such as acoustic and vibration and SPL. As a non-limiting example, the cooling strategy is preprogrammed into the local controller and used based on the desired cooling level. As such, no sensors are needed to measure acoustic environment or vibrations, which leaves just one input from a temperature sensor to determine the desired cooling level for a data storage device.

With the current acoustic conditions around a data storage device understood, the cooling circuit 168 can generate one or more reactive actions to optimize cooling operations. A reactive action can be prescribed by the cooling circuit 168 to alter current acoustic conditions and/or increase cooling effectiveness of the fans. For instance, a reactive action may be the operational alteration of a single fan, or of an entire fan box, such as decreased voltage, different fan speed, or activation of an acoustic baffle. The reactive action(s) may not necessarily mitigate the presence of a dangerous acoustic condition for a data storage device and may instead simply reduce the progression of acoustic conditions towards dangerous levels. In other words, a reactive action may be taken before a dangerous acoustic condition is sensed, or derived.

The ability to prescribe reactive actions to correct or mitigate current acoustic conditions is complemented by the generation of proactive actions by a prediction circuit 170 of the cooling module 160. The prediction circuit 170, in some embodiments, derives future acoustic conditions and data storage performance based on the current operation and acoustic characteristics of a data storage system. The prediction circuit 170 can access previous logs of system operation, model data from other data storage systems, and machine learning techniques to accurately forecast the existence of an acoustic condition, such as high SPL and/or large acoustic impedance gradient.

As a non-limiting example, a prediction circuit 170 can predict, based on real-time current acoustic conditions, that large volumes of data writing by a data storage device will result in the generation of heat that would produce an acoustic impedance gradient if cooled by activation of additional fans. In other example, the prediction circuit 170 can predict that activation of a fan will produce a spike in SPL that jeopardizes data storage device operation. The prediction circuit 170, in another example, could predict that maintaining the current acoustic conditions over time could degrade data storage device performance.

The forecasting of accurate future conditions based on current acoustic and data storage conditions with the prediction circuit 170 can be used to generate one or more proactive actions that are executed by the local controller 162 to prevent, or at least mitigate the effects of, the predicted operational condition. A proactive action may be the activation of a fan, the alteration of a fan speed, or change in data storage device operation. A proactive action may increase the speed of one fan instead of activating an additional fan in response to a forecasted increase in system temperature.

As a result of the assorted aspects of the cooling module 160, the cooling strategy can provide ample cooling for data storage devices with minimal acoustic and vibration disturbance and SPL through the execution of one or more proactive and/or reactive action. The cooling strategy may prescribe a number of different actions that are triggered by predicted, or non-predicted, future events in an effort to maintain system temperature without acoustically damaging data storage device operation over time. Accordingly, the cooling strategy can correct, mitigate, and prevent a number of different operational conditions, which increases corrective efficiency as new cooling strategies are not needed each time a new operational condition is encountered.

Figure 5:
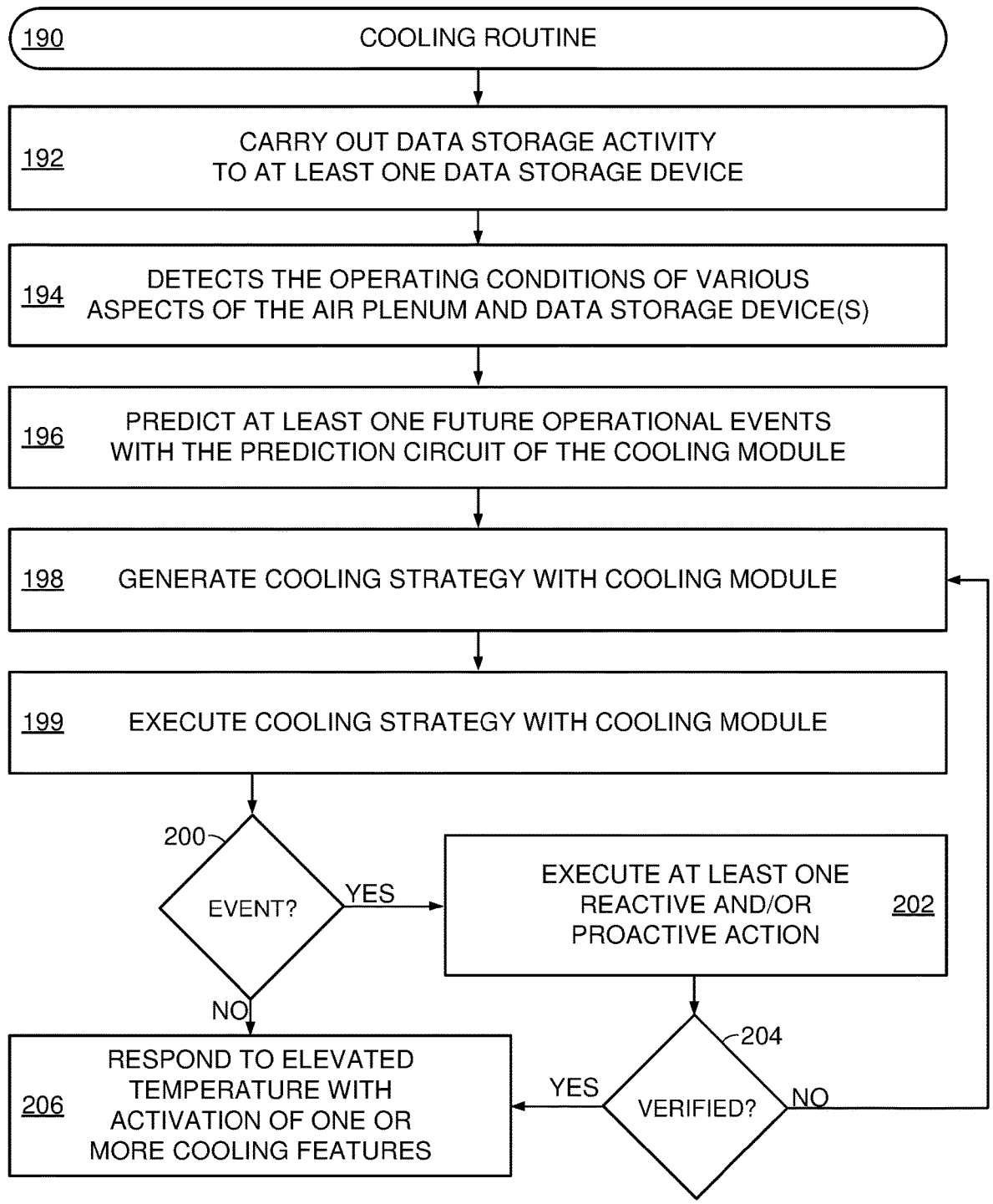
FIG. 5 is an example cooling routine that can be performed with the assorted embodiments of FIGS. 1-4.

FIG. 5 is a flowchart of an example cooling routine 190 that can be carried out by in a data storage system in accordance with various embodiments. The routine 190 begins with a data storage system having multiple cooling features that direct moving air toward at least one data storage device in a housing. It is noted that the data storage system may be a data storage enclosure, a single data storage drive, or a desktop computer, without limitation. The physical positioning of multiple cooling features, such as fans or liquid circulating assemblies, in communication with one or more data storage device can be efficient for convectively maintaining the temperature of the data storage device(s) below a predetermined threshold, such as 50° Celsius.

However, the efficient cooling structure of the cooling features in relation to the data storage device(s) can produce acoustic and vibration disturbance interference that can degrade data storage operation over time. Acoustic impedance and vibration disturbance interference between the respective cooling features can additionally correspond with SPL that vibrate and degrade data storage device operation.

It is contemplated, but not required that each cooling feature of a data storage system is a fan box with four constituent fans that are positioned in sequential order where one fan feeds the intake of another fan, which can be described as first, second, third, and fourth stages. The respective cooling features are connected to a cooling module that may be resident in each fan, each fan box, a data storage device, or the data storage enclosure. In some embodiments, each fan has a controller that carries out fan control as directed by a central cooling module. Other embodiments connect a central controller with the capability to adjust the operating parameters of each fan of each cooling feature.

The structure of the data storage system is utilized to carry out data storage activity to at least one data storage device in step 192. The data storage activity may be data reads, data writes, or device maintenance, such as data migration, that employs the rotating components of the data storage device, which generates heat. Step 192 may be conducted continuously, or cyclically, for an unlimited amount of times until the at least one cooling feature is activated to control temperature at least around the data storage device(s) of the system.

Once cooling operations are active with air being moved to cool the data storage device(s), step 194 detects the cooling conditions of an air plenum and around the data storage device(s) using at least one sensor. The cooling conditions may comprise the operation of the respective fans, the velocity of air, the temperature, and the acoustic parameters, such as SPL and frequency. The cooling conditions are inputted into one or more cooling modules and utilized in step 196 to forecast one or more future operating conditions for the fans, data storage device(s), or system as a whole with aid of a prediction circuit. The future operating conditions are expected to not be currently existing in the cooling conditions and can be indicative of dangerous and non-dangerous operating parameters for the respective data storage devices.

It is contemplated that routine 190 skips step 196 and does not predict future operating conditions or events. In yet, the prediction of future conditions and events as a result of current, real-time cooling conditions can provide greater scope and precision for a cooling strategy generated in step 198. That is, a cooling module can generate a cooling strategy that prescribes corrective actions to current cooling conditions without step 196, but can additionally prescribe preventative actions if step 196 predicts future conditions that can be prevented or mitigated before occurrence. As a result of step 198, a cooling strategy can have multiple different reactive and proactive actions that can be conducted immediately, or in response to a trigger event forecasted in step 196, to reduce or eliminate the acoustic impedance gradient and/or SPL that can degrade data storage device operation over time.

It is noted that the generation of a cooling strategy in step 198 can take into account a number of additional data to complement the currently sensed cooling conditions, such as structural characteristics and operational ranges of the fans and/or data storage device(s). The cooling strategy is then executed in step 199 by at least one controller. The execution of the cooling strategy can involve one or more immediate actions, such as alteration of the speed of at least one fan, as well as one or more triggered actions, such as alteration of fan speed in response to the activation of additional fans or data storage devices.

The execution of the cooling strategy, in some embodiments, can involve no immediate actions and instead consists of triggered reactive and proactive actions that are conducted in response to an encountered event. It is noted that the difference between reactive and proactive actions is that reactive actions operate to correct or mitigate an existing acoustic cooling condition while a proactive action is conducted to prevent or mitigate an acoustic cooling condition that has not occurred yet. Hence, decision 200 can monitor one or more system sensors, fans, and data storage devices continuously, or sporadically, to discover an event identified in cooling strategy.

If decision 200 discovers an event has occurred, step 202 executes one or more proactive or reactive actions as directed by the cooling strategy in an effort to maintain data storage device performance. An event may be a sensed cooling condition, data storage device operating condition, and/or cooling feature operating condition that is to be corrected in step 202 via a reactive action, such as fan speed alteration, or prompts a proactive action, such as activation of an acoustic baffle, to prevent or mitigate the effects of a predicted event, such as high acoustic impedance gradient.

A non-limiting example conducts fan actions so that each active fan operates a different frequency, which prevents acoustic resonance and high SPL. Another non-limiting example of step 202 alters operation of early stage fans to operate faster while later stage fans operate slower. Executed proactive actions may, in some embodiments, command slightly different fan operating speeds, such as within +/−2-3%, in a single fan box, or relative to all other active fans, Step 202 may carry out more than one action and type of action as prescribed by the cooling strategy. The effectiveness of those actions, and the cooling strategy, executed in step 202 is verified in decision 204 by performing one or more tests to ensure cooling conditions and/or data storage device operating conditions. A test may involve a simple sensor reading and/or execution of a test sequence, such as writing test data to a data storage device, deactivating a fan, or activing a fan. The test may be prescribed in the cooling strategy or conducted by a local cooling module controller in a progressive manner that assesses the effectiveness of executed actions with a sequence of sensor readings and/or operational deviations.

In the event decision 204 determines the actions performed in step 202 were effective and in line with the cooling conditions prescribed from the cooling strategy, step 206 conducts fan activation, and deactivation, to maintain the data storage device(s) of the system below a threshold temperature. That is, step 206 conducts normal cooling activity without deviating the operational parameters of individual fans in response to detected temperature. The normal cooling activities of step 206 are also triggered if no operational event of the cooling strategy is discovered in decision 200.

A determination that the action(s) carried out in step were ineffective at optimizing the acoustic properties of cooling operations prompts a return to step 196 where a new cooling strategy is developed due to the ineffectiveness of the existing cooling strategy. The ability to revisit a cooling strategy and update reactive and/or proactive actions in response to current, real-time cooling and operating conditions allows the cooling strategy to continually be effective at correcting, mitigating, and preventing a variety of different acoustic conditions associated with cooling that can degrade data storage device operation over time.

Through the assorted embodiments of a data storage system, data storage device operation can be conducted without being degraded by cooling operations. The generation of a cooling strategy that prescribes actions to intelligently react, or prevent, to a variety of different operational conditions ensures the detection of cooling and data storage conditions is efficiently handled. Consequently, acoustic impedance gradient and SPL can be maintained at non-dangerous levels despite dynamic operation of the data storage devices of the system and changing environmental conditions around the cooling features and data storage devices.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. A method comprising:
    positioning a first cooling feature and a second cooling feature on a first side of an air plenum, opposite a data storage device positioned on a second side of the air plenum;
    connecting the first cooling feature and the second cooling feature to a cooling module; and
    adjusting a speed of the first cooling feature as directed by the cooling module to be +/−2-3% of a speed of a second cooling feature proactively in response to a detected operational condition in the data storage device predicted by the cooling module to correspond to an acoustic impedance mismatch in the air plenum, the speed adjustment preventing the acoustic impedance mismatch from occurring.

2. The method of claim 1, wherein a speed of the second cooling feature remains unchanged during the adjustment of the first cooling feature.

3. The method of claim 1, wherein the first cooling feature and the second cooling feature are in a single fan box located within a housing with the air plenum and data storage device.

4. The method of claim 1, wherein the speed of the first cooling feature is set to provide a first cooling frequency that is different and non-overlapping than a second cooling frequency of the second cooling feature.

5. The method of claim 1, wherein the detected operational condition is a position error signal.

6. The method of claim 1, wherein the detected operational condition is data access latency.

7. The method of claim 1, wherein the acoustic impedance mismatch corresponds with a first acoustic impedance between the first cooling feature and the data storage device that is different than a second acoustic impedance between the second cooling feature and the data storage device.

8. An apparatus comprising a first cooling feature and a second cooling feature are each positioned on an opposite side of an air plenum from a data storage device, each cooling feature connected to a cooling module configured to adjust a speed of the first cooling feature in response to a detected operational condition in the data storage device predicted to correspond to an acoustic impedance mismatch in the air plenum, the speed adjustment executed to proactively prevent the acoustic impedance mismatch from occurring in the air plenum.

9. The apparatus of claim 8, wherein the data storage device, each cooling feature, and the air plenum are all positioned within a single housing.

10. The apparatus of claim 8, wherein each cooling feature comprises a plurality of progressively staged fans.

11. The apparatus of claim 8, wherein a plurality of data storage devices are positioned on the opposite side of the air plenum from the cooling features.

12. The apparatus of claim 8, wherein the cooling module is connected to at least one sensor positioned to detect operational conditions within the air plenum.

13. A method comprising:
    positioning a first cooling feature and a second cooling feature on a first side of an air plenum, opposite a data storage device positioned on a second side of the air plenum;
    connecting the first cooling feature and the second cooling feature to a cooling module;
    conducting a data access request to the data storage device;
    detecting operating conditions during the data access request with the cooling module;
    generating a cooling strategy with the cooling module derived from the detected operating conditions, the cooling strategy prescribing at least one proactive cooling feature operational adjustment to prevent an acoustic impedance mismatch in the air plenum; and
    adjusting a speed of the first cooling feature as directed by the cooling module and the cooling strategy in response to a detected operational event predicted by the cooling module to correspond with an acoustic impedance mismatch in the air plenum, the speed adjustment preventing the acoustic impedance mismatch from occurring.

14. The method of claim 13, wherein the cooling strategy is generated by a cooling circuit of the cooling module and executed by a controller of the cooling module.

15. The method of claim 14, wherein the cooling circuit derives an acoustic impedance in the air plenum from the operating conditions detected during the data access request.

16. The method of claim 13, wherein the cooling strategy prescribes at least two different reactive actions in response to different operational events.

17. The method of claim 16, wherein each reactive action is conducted to reduce an acoustic impedance gradient in the air plenum.

18. The method of claim 13, wherein the cooling strategy prescribes multiple different proactive actions in response to the detected operational event.

19. The method of claim 13, wherein the at least one proactive action is conducted prior to an acoustic impedance gradient being experienced in the air plenum.

20. The method of claim 19, wherein the at least one proactive action is executed to prevent the acoustic impedance gradient from occurring in the air plenum.

* * * * *